(12) United States Patent
Schuurmans et al.

(10) Patent No.: US 7,256,407 B2
(45) Date of Patent: Aug. 14, 2007

(54) LITHOGRAPHIC PROJECTION APPARATUS AND REFLECTOR ASSEMBLY FOR USE THEREIN

(75) Inventors: Frank Jeroen Pieter Schuurmans, Valkenswaard (NL); Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/224,084

(22) Filed: Sep. 13, 2005

(65) Prior Publication Data
US 2006/0006350 A1 Jan. 12, 2006

Related U.S. Application Data

(63) Continuation of application No. 10/647,120, filed on Aug. 25, 2003.

(30) Foreign Application Priority Data
Aug. 27, 2002 (EP) .................................. 02078528

(51) Int. Cl.
*H01J 37/00* (2006.01)
*G21K 5/00* (2006.01)
(52) U.S. Cl. .................. 250/504 R; 250/492.2; 378/34; 378/35; 355/30
(58) Field of Classification Search ............ 250/492.2
See application file for complete search history.

(56) References Cited

U.S. PATENT DOCUMENTS

| | | | |
|---|---|---|---|
| 4,206,494 A | 6/1980 | Lovering | |
| 4,916,322 A * | 4/1990 | Glavish et al. | 250/492.2 |
| 5,768,339 A | 6/1998 | O'Hara | |
| 6,064,072 A | 5/2000 | Partlo et al. | |
| 6,285,737 B1 | 9/2001 | Sweatt et al. | |
| 6,377,655 B1 | 4/2002 | Murakami et al. | |
| 6,566,667 B1 | 5/2003 | Partlo et al. | |
| 6,683,936 B2 * | 1/2004 | Jonkers | 378/34 |
| 6,753,941 B2 * | 6/2004 | Visser | 355/30 |
| 2003/0043455 A1 * | 3/2003 | Singer et al. | 359/357 |
| 2003/0095623 A1 * | 5/2003 | Singer et al. | 378/34 |
| 2004/0065817 A1 * | 4/2004 | Singer et al. | 250/228 |

* cited by examiner

*Primary Examiner*—Robert Kim
*Assistant Examiner*—James J. Leybourne
(74) *Attorney, Agent, or Firm*—Pillsbury Winthrop Shaw Pittman LLP

(57) ABSTRACT

A lithographic projection apparatus includes reflector assembly, a foil trap, and a housing that is constructed and arranged to contain the reflector assembly and the foil trap. The reflector assembly is connected to the housing via a first wall, and the foil trap is connected to the housing via a second wall. The apparatus also includes a chamber between the foil trap and the reflector assembly. The chamber is defined by the housing, the first wall, and the second wall. The apparatus further includes a pump that is configured to create a vacuum in the chamber.

20 Claims, 3 Drawing Sheets

LITHOGRAPHIC PROJECTION APPARATUS AND REFLECTOR ASSEMBLY FOR USE THEREIN

CROSS REFERENCE TO RELATED APPLICATIONS

This application is a continuation of U.S. application Ser. No. 10/647,120, filed Aug. 25, 2003, which claims priority to EP 02078528.3, filed Aug. 27, 2002, the entire contents of all of which are incorporated herein by reference.

BACKGROUND OF THE INVENTION

1. Field of the Invention

The present invention relates to a lithographic projection apparatus and a reflector assembly for use therein.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In a lithographic apparatus the size of features that can be imagined onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range 5 to 20 nm, especially around 13 nm. Such radiation is termed extreme ultraviolet (EUV) or soft x-ray and possible sources include, for instance, laser-produced plasma sources, discharge plasma sources, or synchrotron radiation from electron storage rings. Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136-156 (2000); M. W. McGeoch, "Power Scaling of a Z-pinch Extreme Ultraviolet Source", Proc. SPIE 3997, pp. 861-866 (2000); W. T. Silfvast, M. Klosner, G. Shimkaveg, H. Bender, G. Kubiak, N. Fomaciari, "High-Power Plasma Discharge Source at 13.5 and 11.4 nm for EUV lithography", Proc. SPIE 3676, pp. 272-275 (1999); and K. Bergmann et al., "Highly Repetitive, Extreme Ultraviolet Radiation Source Based on a Gas-Discharge Plasma", Applied Optics, Vol. 38, pp. 5413-5417 (1999).

EUV radiation sources may require the use of a rather high partial pressure of a gas or vapor to emit EUV radiation, such as discharge plasma radiation sources referred to above. In a discharge plasma source, for instance, a discharge is created in between electrodes, and a resulting partially ionized plasma may subsequently be caused to collapse to yield a very hot plasma that emits radiation in the EUV range. The very hot plasma is quite often created in Xe, since a Xe plasma radiates in the Extreme UV (EUV) range around 13.5 nm. For an efficient EUV production, a typical pressure of 0.1 mbar is required near the electrodes to the radiation source. A drawback of having such a rather high Xe pressure is that Xe gas absorbs EUV radiation. For example, 0.1 mbar Xe transmits over 1 m only 0.3% EUV radiation having a wavelength of 13.5 nm. It is therefore required to confine the rather high Xe pressure to a limited region around the source. To reach this the source can be contained in its own vacuum chamber that is separated by a chamber wall from a subsequent vacuum chamber in which the collector mirror and illumination optics may be obtained.

Thermal radiation emanating from, among others, the EUV source and the foil trap in a lithographic projection apparatus results in heating of the objects on which it impinges. In a lithographic projection apparatus these objects will generally be the optical components which make up the apparatus. An example of an optical component placed in the vicinity of the source, may be formed by a set of reflectors which function as a collector for light emanating from the source. Heating up of the collector due to this thermal radiation leads to expansion of parts in the collector causing geometrical aberrations of the collector and, ultimately, leads to its destruction.

SUMMARY OF THE INVENTION

It is an aspect of the present invention to provide a lithographic projection apparatus with a reflective element, in particular a collector, for which the radiative heat load is reduced.

It is another aspect of the present invention to provide a lithographic projection apparatus with a reflective element, in particular a collector, that is effectively cooled.

It is yet another aspect of the present invention to provide a collector with a relatively long life span.

This and other aspects are achieved according to the present invention in a lithographic apparatus an illumination system configured to form a beam of radiation from radiation provided by a radiation source, a support configured to hold a patterning device which is to be irradiated by the beam to pattern the beam, a substrate table configured to hold a substrate, and a projection system configured to image an irradiated portion of the patterning device onto a target portion of the substrate, wherein a reflector assembly is placed in the vicinity of the source or an image of the source, the reflector assembly including at least an inner and an outer reflector extending in the direction of an optical axis on which the source or an image of the source is located, the inner reflector being closer than the outer reflector to the optical axis, the reflectors each having an inner reflective surface and an outer backing layer, the backing layer of the inner reflector being covered with a reflective layer having a reflectivity of between 0.7 and 0.99, preferably between 0.8 and 0.99, for wavelengths between 0.1 and 100 µm, preferably between 1 and 10 µm. Thus, the reflector assembly will reflect a substantial amount of the infrared radiation that impinges upon the back of the reflector, which will reduce the heat load on the reflector assembly.

In another embodiment of the invention, a reflector assembly is placed in the vicinity of the source or an image of the source, the reflector assembly comprising at least an inner and an outer reflector extending in the direction of an optical axis on which the source or an image of the source is located, the inner reflector being closer to the optical axis than the outer reflector, the reflectors each having an inner reflective surface and an outer backing layer, the backing layer of the outer reflector being covered with a radiative layer having an emissivity of, typically 0.8, for wavelengths between 0.1 and 100 µm, preferably between 1 and 10 µm. By providing the backing layer of the outer reflector with relatively strong infrared radiation emitting properties, increased amounts of radiation are emitted by the reflector assembly resulting in improved radiation cooling.

In yet another embodiment of the invention a reflector assembly is placed in the vicinity of the source or an image of the source, the reflector assembly comprising at least an inner and an outer reflector extending in the direction of an optical axis on which the source or an image of the source is located, the inner reflector being closer to the optical axis than the outer reflector, the reflectors each having an inner reflective surface and an outer backing layer, the backing layer of the outer reflector being covered with a radiative layer having an emissivity of, typically 0.8, for wavelengths between 0.1 and 100 µm, preferably between 1 and 10 µm and the backing layer of the inner reflector is covered with a reflective layer having a reflectivity of, typically 0.9 or more, for wavelengths between 0.1 and 100 µm, preferably between 1 and 10 µm. The reflector assembly thus has both a reflective coating on the backing layer of the inner reflectors and a radiative coating on the backing of the outermost reflector, for both reducing the absorbed heat radiation and increasing the emitted heat radiation.

The reflective layer may be made of a noble metal, such as, for example, gold or ruthenium. The radiative layer may be made of carbon for heat load reductive properties.

Each reflector may comprise at least two adjacent reflecting surfaces, the reflecting surfaces further from the source being placed at smaller angles to the optical axis than the reflecting surface that is closer to the source. In this way, a grazing incidence collector is constructed for generating a beam of UV radiation propagating along the optical axis. Preferably, at least two reflectors are placed substantially coaxially and extend substantially rotationally symmetric around the optical axis. A grazing incidence collector of this (Wolter-) type is, for instance, described in German patent application, DE 101 38 284.7, which is equivalent to U.S. Patent Application Publication 2003/0095623 A1 which is incorporated herein by reference. The collector which results can be used as an (E)UV radiation focusing device in a lithographic projection apparatus.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
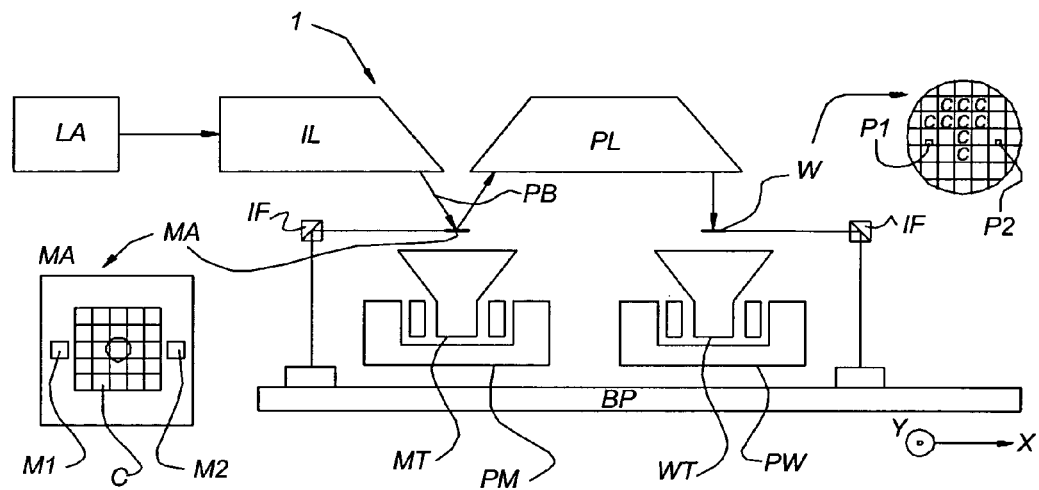
FIG. 1 schematically depicts a lithographic projection apparatus according to an embodiment of the present invention.

FIG. 1 schematically depicts a lithographic projection apparatus 1 according to an embodiment of the invention. The apparatus 1 includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander, for example. The illuminator IL may comprise an adjusting device configured to set the outer and/or inner radial extent (commonly referred to as σ-outer and σ-inner, respectively) of the intensity distribution in the beam PB. In addition, it will generally comprise various other components, such as an integrator and a condenser. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

1. The depicted apparatus can be used in two different modes: In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
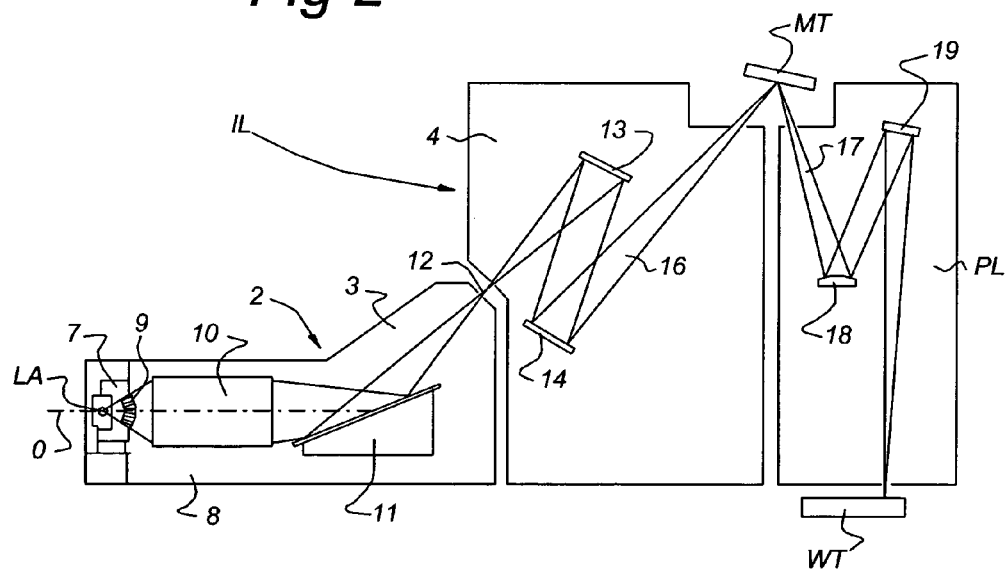
FIG. 2. shows a side view of an EUV illuminating system and projection optics of a lithographic projection apparatus according to the present invention.
Figure 3:
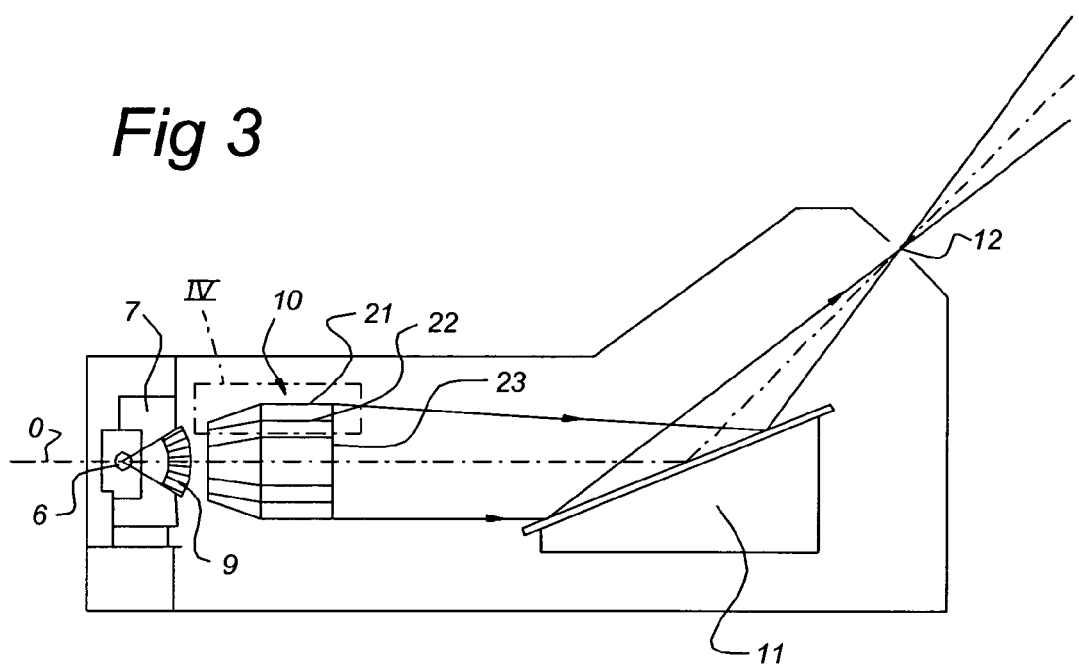
FIG. 3 shows a detail of the radiation source and grazing incidence collector of the present invention.

FIG. 2 shows the projection apparatus 1 comprising an illumination system IL, a source-collector module or radiation unit 3, illumination optics unit 4, and projection optics system PL. A radiation system 2 comprises the source-collector module or radiation unit 3 and the illumination optics unit 4. The radiation unit 3 is provided with a radiation source LA, which may be formed by a discharge plasma. Referring to FIG. 3, an EUV radiation source 6 may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis O. Partial pressures of 0.1 mbar of Xe, Li vapor or any other suitable gas or vapor may be required for efficient generation of the radiation. The radiation emitted by radiation source LA is passed from the source chamber 7 into collector chamber 8 via a gas barrier or "foil trap" 9. The gas barrier 9 comprises a channel structure such as, for instance, described in detail in U.S. Patent Application Publication 2002/0154279 A1 and U.S. Pat. No. 6,359,969.

The collector chamber 8 comprises a radiation collector 10 which according to the present invention is formed by a grazing incidence collector. Radiation passed by collector 10 is reflected off a grating spectral filter 11 to be focused in a virtual source point 12 at an aperture in the collector chamber 8. From chamber 8, the beam 16 is reflected in illumination optics unit 4 via normal incidence reflectors 13, 14 onto a reticle or mask positioned on reticle or mask table MT. A patterned beam 17 is formed which is imaged in projection optics system PL via reflective elements 18, 19 onto wafer stage or substrate table WT. More elements than shown may generally be present in illumination optics unit 4 and projection system PL.

As can be seen in FIG. 3, the grazing incidence collector 10 comprises a number of nested reflector elements 21, 22, 23. A grazing incidence collector of this type is, for example, shown in U.S. Patent Application Publication 2003/0095623 A1.

Figure 4:
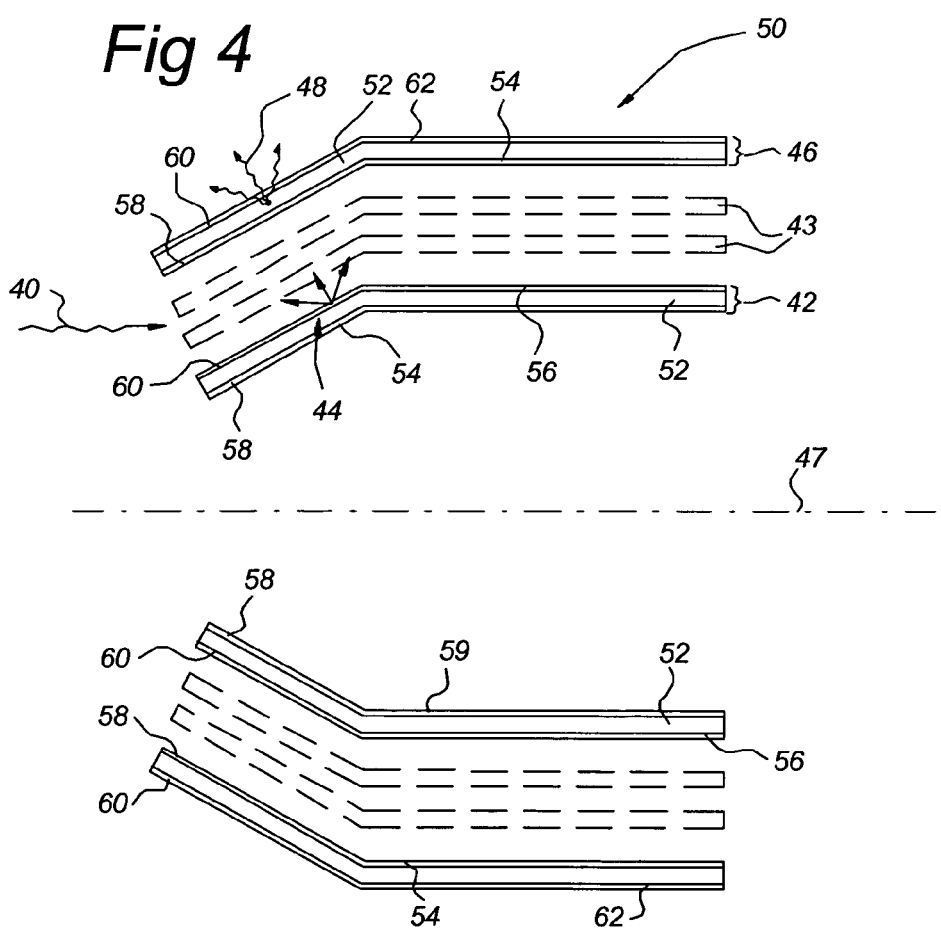
FIG. 4 shows an axial cross-sectional view of a collector layout according to the present invention.

As indicated in FIG. 4, the infrared radiation 40 impinges on a collector 50 which is aligned along an optical axis 47. The collector 50 may comprise several reflectors 42, 43, 46. An example of such a collector is shown in FIG. 3 with reference numeral 10. In FIG. 4, the inner reflector is indicated by reference numeral 42, the outer reflector is indicated by reference numeral 46. In between the reflectors 42 and 46 several other reflectors 43 may be located, the outlines of which are shown in FIG. 4 with dashed lines. All the reflectors 42 and 43 are coated on their backing layer 52 with a heat/infrared radiation reflecting layer 56, such that infrared radiation 40 on these reflectors is reflected as indicated by the arrows 44. The outer reflector 46 has on its backing layer 52 a radiative coating 62. The arrows 48 in FIG. 4 indicate heat/infrared radiation.

In FIG. 4, further detailed composition of the inner reflector 42 of the collector 50 is illustrated. The reflector 42 includes a backing layer 52 made of material that gives the reflector 42 its mechanical strength e.g. nickel (Ni) of thickness 0.5 to 1 mm. The reflectors 42, 43 and 46 include an (E)UV reflecting side, in FIG. 4, as an example, shown including two parts 58 and 59. On the (E)UV mirroring side 58 of the reflector 42, a coating 54 is added of a material that will give the reflector its requested (E)UV reflecting properties, such as, for example, gold (Au) or ruthenium (Ru), of thicknesses in the range of approximately 50 nanometers to several microns. According to the present invention, the manufacturing process of depositing a noble metal layer 54 as an (E)UV reflective layer is extended in that on the side 60 of the backing layer 52 a further coating 56, such as, for example, gold of thickness such that in can be considered as infinitely thick for the infrared radiation, i.e. approximately several microns, or another infrared radiation reflecting material, is added, by known techniques such as, for example, chemical vapor or electrochemical deposition. Coating 56 is substantially reflecting for heat/infrared radiation, which results in less heat/infrared absorption of the backing layer 52.

In FIG. 4, the detailed composition of the outer reflector 46 is illustrated. Instead of a heat/infrared mirroring layer 56 that covers the backing layer 52 as is the case for the inner layers 42, 43, the backing layer 52 of the outer reflector 46 is covered on the outside 60 with a heat/infrared radiative layer 62 made of, for example, carbon (C), several microns thick or any other heat/infrared radiative material known to the those of ordinary skill. The carbon coating will enhance the "black body" emissivity of the outermost reflector 46 and hence of the entire collector 50.

The mirroring side 58 of the reflectors 42, 43 and 46 in FIG. 4 may be curved. It may include two joining segments one of which is shaped as the segment of a hyperbola and one of which is shaped as a ellipsoid.

Figure 5:
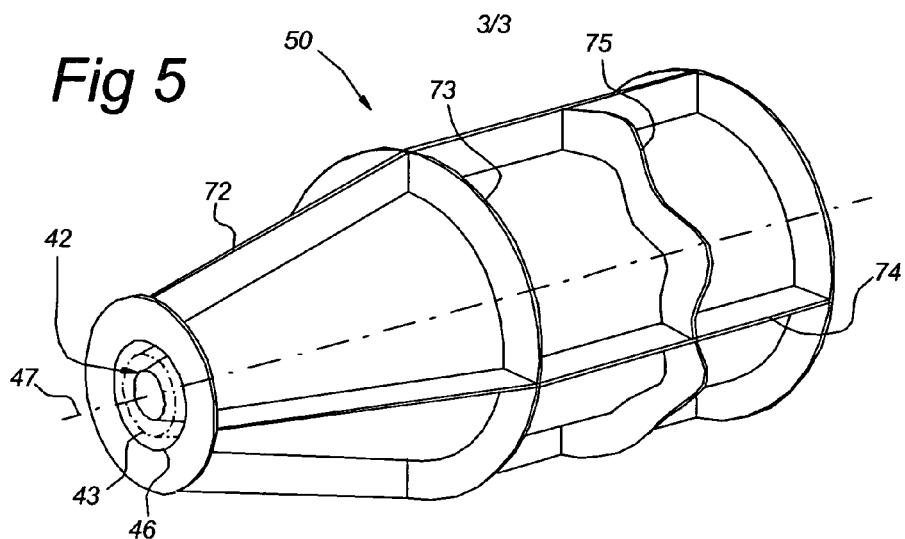
FIG. 5 shows a perspective side view of an embodiment of the collector equipped with radiation fins.

In FIG. 5, a collector 50 is shown which has on its outer reflector 46 several radiation fins 72-75 attached. These radiation fins 72-75 may be arbitrarily distributed on the outer reflector 46. The radiation fins 72-75 may increase the heat/infrared "black body" reflecting properties of the collector 50 even further.

In another embodiment, an improved vacuum separation between the EUV source and the optical components further along the optical axis may be achieved by using a collector that is part of a vacuum separation. This is realized by pumping the space that separates the collector from the other components in the lithographic projection apparatus. By using a reflector as described in U.S. Patent Application Publication 2003/0095623 A1, use is made of the relatively high flow resistance of the "onion-shell" type collector. The outside of the collector may form a vacuum barrier, while a pump may be employed immediately downstream of the reflector for pumping off residual gas passing through the collector at relatively low pumping rates such as 1 mbar·l/s.

Figure 6:
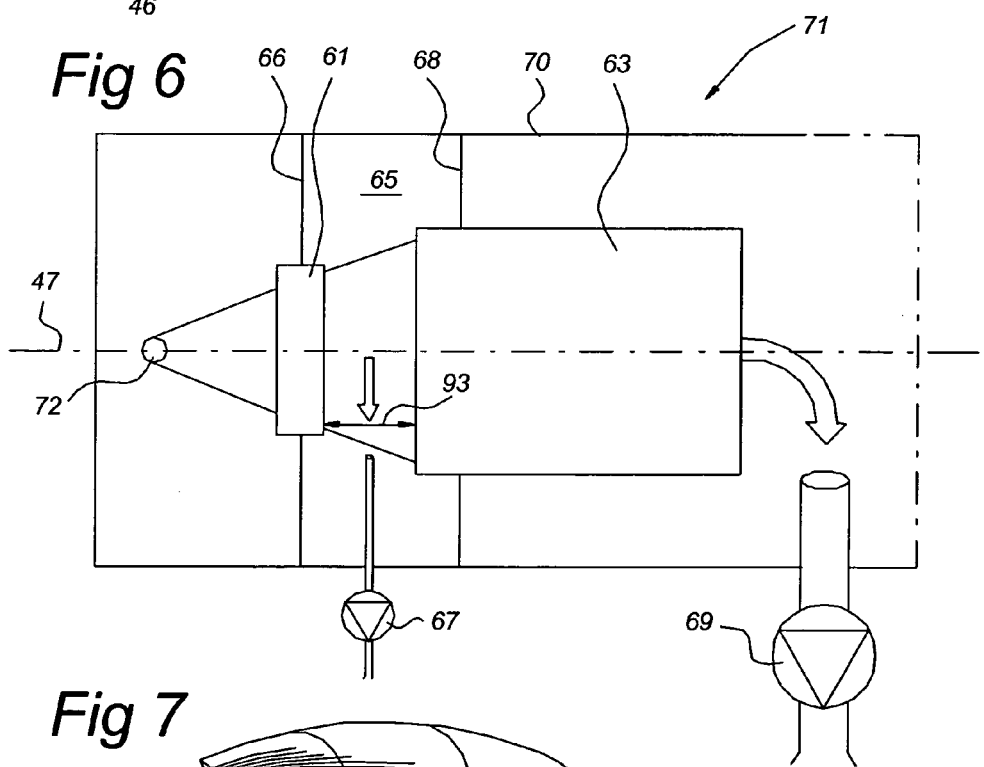
FIG. 6 shows a schematic view of an embodiment of a lithographic projection apparatus having two differential pressure chambers.

This embodiment will be described with reference to FIG. 6. In FIG. 6, part of an EUV illuminator 71 is shown. A channel array or foil trap 61 is provided between EUV source 72 and a collector 63. Due to the limited flow conductance of the channel array or foil trap 61, the pressure behind this array can be at least a 100 times lower than at the side of the EUV source 72, when a pump speed of several 1000 l/s can be reached behind the channel array 61. In view of the close distance of collector 63, this pump speed cannot be achieved by pump 67. A channel array 61 suitable for use in the present invention has been described in U.S. Patent Application Publication 2002/0154279 A1 and U.S. Pat. No. 6,359,696. The collector 63 may be a multi-shell grazing-incidence EUV collector 63 of the type as described in U.S. Patent Application Publication 2003/0095623A1. These two components are connected via circumferential walls 66, 68 to housing 70 to constitute a vacuum chamber 65. The vacuum chamber 65 is evacuated by a pump 67. Due to the small separation 93 between the foil trap 61 and the grazing incidence EUV collector 63 of a few centimeters, which is kept as small as possible to limit the size of the EUV illuminator, the pump 67 will not be able to create a sufficient vacuum in the chamber 65 as the effective pump speed of pump 67 may be only a few 100 l/s. Therefore, a second pump 69 is arranged behind the grazing incidence EUV collector 63. The grazing incidence EUV collector 63 has a limited flow conductance such as 200 l/s. The pumps 67 and 69 together create the desired vacuum in the vacuum chamber 65, at a pump speed of several 100 l/s for pump 67 and several 1000 l/s for pump 69.

Figure 7:
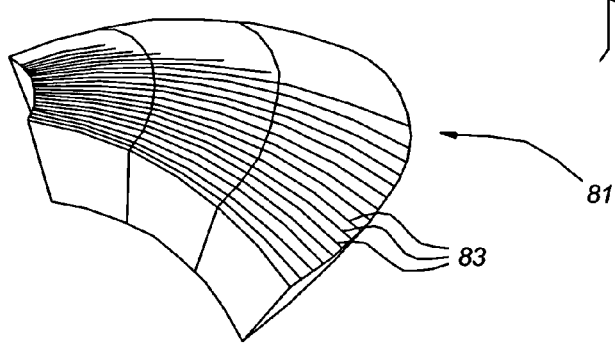
FIG. 7 is a detailed view of the structure of a foil trap.

In FIG. 7 the detailed structure 81 of a part of the foil trap 61 is shown. The structure 81 consists of narrowly spaced slits or narrow elongated channels 83 which together form an open laminar structure. Also, the grazing incidence EUV collector 63 includes, due to its onion like shell structure, open laminar channels.

While specific embodiments of the invention have been described above, it will be appreciated that the invention may be practiced otherwise than as described. The description is not intended to limit the invention.

What is claimed is:

1. A lithographic projection apparatus, comprising:
    an illumination system configured to form a beam of radiation from radiation provided by an EUV radiation source;
    a support configured to hold a patterning device which is to be irradiated by the beam to pattern the beam;
    a substrate table configured to hold a substrate;
    a projection system configured to image an irradiated portion of the patterning device onto a target portion of the substrate;
    a reflector assembly placed in the vicinity of the source or an image of the EUV radiation source, the reflector assembly comprising at least an inner and an outer reflector extending in a direction of an optical axis on which the EUV radiation source or an image of the EUV radiation source is located, the inner reflector being closer to the optical axis than the outer reflector, the inner and outer reflectors each having an inner reflective surface and an outer backing layer, the inner reflective surface of the outer reflector facing the backing layer of the inner reflector;
    a foil trap configured to collect debris from the EUV radiation source, the foil trap being between the EUV radiation source and the reflector assembly;
    a housing constructed and arranged to contain the reflector assembly and the foil trap, the reflector assembly being connected to the housing via a first wall, and the foil trap being connected to the housing via a second wall;
    a chamber between the foil trap and the reflector assembly, the chamber being defined by the housing, the first wall, and the second wall; and
    a pump configured to create a vacuum in the chamber.

2. A lithographic projection apparatus according to claim 1, the housing constructed and arranged to contain the EUV radiation source.

3. A lithographic projection apparatus according to claim 1, further comprising a second pump configured to evacuate a space in the housing behind the reflector assembly.

4. A lithographic projection apparatus according to claim 1, wherein the outer backing layer of the inner reflectors is covered with a reflective layer having a reflectivity of between 0.7 and 0.99 for wavelengths between 0.1 and 100 µm.

5. A lithographic projection apparatus according to claim 1, wherein the outer backing layer of the outer reflector is covered with a radiative layer having a emissivity of between 0.6 and 0.95 for wavelengths between 0.1 and 100 µm.

6. A lithographic projection apparatus according to claim 5, wherein the radiative layer comprises carbon.

7. A lithographic projection apparatus according to claim 1, wherein the inner reflective layer comprises a noble metal.

8. A lithographic projection apparatus according to claim 7, wherein the noble metal comprises gold or ruthenium.

9. A lithographic projection apparatus according to claim 1, wherein the inner and outer reflectors are substantially coaxial and extend substantially rotationally symmetric around the optical axis.

10. A lithographic projection apparatus according to claim 1 wherein at least the outer reflector comprises radiation fins.

11. An assembly for collecting EUV radiation from an EUV radiation source, the assembly comprising:
    a reflector assembly placed in the vicinity of the source or an image of the EUV radiation source, the reflector assembly comprising at least an inner and an outer reflector extending in a direction of an optical axis on which the EUV radiation source or an image of the EUV radiation source is located, the inner reflector being closer to the optical axis than the outer reflector, the inner and outer reflectors each having an inner reflective surface and an outer backing layer, the inner reflective surface of the outer reflector facing the backing layer of the inner reflector;
    a foil trap configured to collect debris from the EUV radiation source, the foil trap being between the EUV radiation source and the reflector assembly;

a housing constructed and arranged to contain the reflector assembly and the foil trap, the reflector assembly being connected to the housing via a first wall, and the foil trap being connected to the housing via a second wall;

a chamber between the foil trap and the reflector assembly, the chamber being defined by the housing, the first wall, and the second wall; and a pump configured to create a vacuum in the chamber.

12. An assembly according to claim 11, wherein the housing is constructed and arranged to contain the EUV radiation source.

13. An assembly according to claim 11, further comprising a second pump configured to evacuate a space in the housing behind the reflector assembly.

14. An assembly according to claim 11, wherein the outer backing layer of the inner reflectors is covered with a reflective layer having a reflectivity of between 0.7 and 0.99 for wavelengths between 0.1 and 100 µm.

15. An assembly according to claim 11, wherein the outer backing layer of the outer reflector is covered with a radiative layer having a emissivity of between 0.6 and 0.95 for wavelengths between 0.1 and 100 µm.

16. An assembly according to claim 15, wherein the radiative layer comprises carbon.

17. An assembly according to claim 11, wherein the inner reflective layer comprises a noble metal.

18. An assembly according to claim 17, wherein the noble metal comprises gold or ruthenium.

19. An assembly according to claim 11, wherein the inner and outer reflectors are substantially coaxial and extend substantially rotationally symmetric around the optical axis.

20. An assembly according to claim 11, wherein at least the outer reflector comprises radiation fins.

* * * * *